United States Patent [19]
Lopez et al.

[11] Patent Number: 6,021,047
[45] Date of Patent: Feb. 1, 2000

[54] COMPUTER AND A RACK MOUNT SYSTEM AND METHOD FOR A COMPUTER

[75] Inventors: Arthur Lopez; Steve Sands, both of Austin, Tex.

[73] Assignee: Dell U.S.A., L,P., Round Rock, Tex.

[21] Appl. No.: 08/958,147

[22] Filed: Oct. 24, 1997

[51] Int. Cl.[7] .................................. G06F 1/16; H05K 5/00
[52] U.S. Cl. ........................................ 361/727; 312/223.2
[58] Field of Search ..................... 361/724–727, 361/683; 312/223.1, 223.2, 223.3, 310, 330.1

[56] References Cited

U.S. PATENT DOCUMENTS

| | | | |
|---|---|---|---|
| 4,766,422 | 8/1988 | Wolters et al. ....................... | 312/223.3 |
| 5,388,032 | 2/1995 | Gill et al. ............................. | 364/146 |
| 5,460,441 | 10/1995 | Hastings et al. . | |
| 5,579,924 | 12/1996 | Sands et al. . | |
| 5,586,003 | 12/1996 | Schmitt et al. . | |
| 5,791,498 | 8/1998 | Mills ........................................ | 211/26 |
| 5,896,273 | 4/1999 | Varghese et al. ....................... | 361/724 |

OTHER PUBLICATIONS

General Devices Co., *Ball Bearing Slides, High–precision, smooth–gliding, telescoping slides*, May 16, 1997.

*Primary Examiner*—Lynn D. Feild
*Attorney, Agent, or Firm*—Haynes and Boone, L.L.P.

[57] ABSTRACT

A computer and a rack mount system and method for mounting a computer in which the computer is mounted on a shelf that is slidable to a position outside the cabinet of the rack mount system. The computer is then slid in a direction transverse to the first direction after which it is pivoted relative to the shelf to permit it to be serviced.

44 Claims, 4 Drawing Sheets

COMPUTER AND A RACK MOUNT SYSTEM AND METHOD FOR A COMPUTER

BACKGROUND

The present invention relates to a computer and a rack mount system and method for mounting a computer, and, more particularly, to such a system and method in which the computer can be moved relative to the rack and pivoted to enable it to be serviced.

In large installations involving a plurality of computers, such as mini-tower or mid-tower computers, the individual computers are usually placed on a rack mount system formed by a cabinet having a plurality of vertically stacked shelves. Although these systems are desirable from a space efficiency standpoint, they are less than desirable when one or more of the computers must be serviced. For example, since it is virtually impossible to service the computer when it is in the cabinet, the computers must be removed from the shelves and placed on some other surface for service. This is very inconvenient especially since several cables must be disconnected from the computer and reconnected when the computer is returned to the cabinet. To eliminate this inconvenience, the shelves in some rack mount systems are slidable to and from the cabinet to enable the computers to remain on the shelves while they are serviced so that their cables do not have to be disconnected. However, in the case of a mini-tower or mid-tower computer, that is, a computer having a chassis whose height exceed its width, if the width of the chassis is not small enough to permit two computers to be placed upright in a side-by-side relationship within the enclosure, then valuable space will be wasted accommodating just one. Even if the chassis are designed so that they can be placed in a side-by-side relationship, it may produce an undesirable constraint on other aspects of the design.

Alternatively, a mini-tower or mid-tower computer may be placed on the shelf on one of its sides so that its width exceeds its height if the resulting width does not exceed the horizontal opening of the enclosure. However, in this configuration, the computer must be manually rotated to an upright position to permit its side covers to be removed for service.

Of course, the computer can be designed to be rack mountable from its inception. However, time, budget, and resource constraints reduce the practicality of such a design, especially when the manufacturer modifies existing computers that were not originally designed to be rack-mountable.

SUMMARY

The present invention, therefore, provides a system and method according to which a component, such as a computer, is rack mountable, yet can easily be positioned for service without removing it from the rack mount system.

To this end, a rack mount system and method for a computer is provided according to which a shelf is provided for receiving the computer and is slidable to a position in which the computer extends outside the cabinet of the rack mount system. The computer is then slid in a direction transverse to the first direction after which it is pivoted relative to the shelf to permit it to be serviced.

A major advantage is achieved with the system and method of the present invention since all the space-efficiency advantages of a rack mount system are retained while the computer is easily positioned for service without having to remove it from the shelf.

DESCRIPTION OF THE PREFERRED EMBODIMENT

Figure 1:
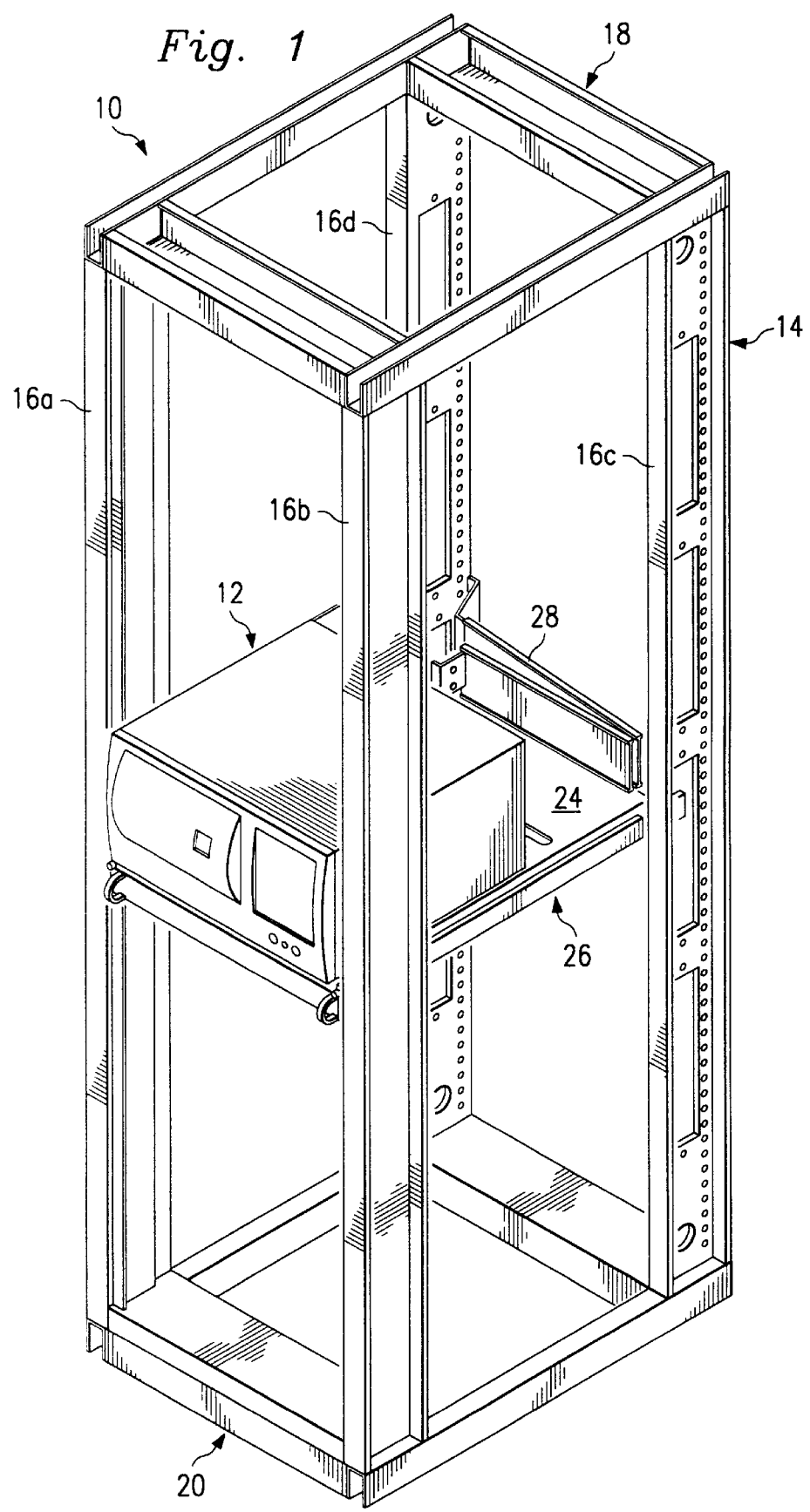
FIG. 1 is an isometric view of the rack mount system of the present invention with a computer mounted on a shelf of the rack mount system.

Referring to FIG. 1 of the drawings, the reference numeral 10 refers, in general, to the rack mount system of the present invention which is designed to store a plurality of computers, one of which is shown in general by the reference numeral 12. The system 10 includes a cabinet 14 formed by four spaced upright members 16a–16d which form the corners of the cabinet. A top frame assembly 18 and a bottom frame assembly 20 are respectively attached to the upper ends and the lower ends of the members 16a–16d in any known manner.

A shelf 24 is attached to the upright members 16a–16d by a pair of ball bearing slides, one of which is shown by the reference numeral 26. These slides, including the slide 26, are conventional and enable the shelf 24 to be moved from a retracted position shown in FIG. 1 to an extended position shown in FIG. 2 in which the computer 12 extends outside the cabinet 14 so that it can be serviced. For example, the slides, including the slide 26, can be of the type manufactured by General Devices of Indianapolis, Ind. and well documented in their promotional materials, which are incorporated by reference.

Figure 2:
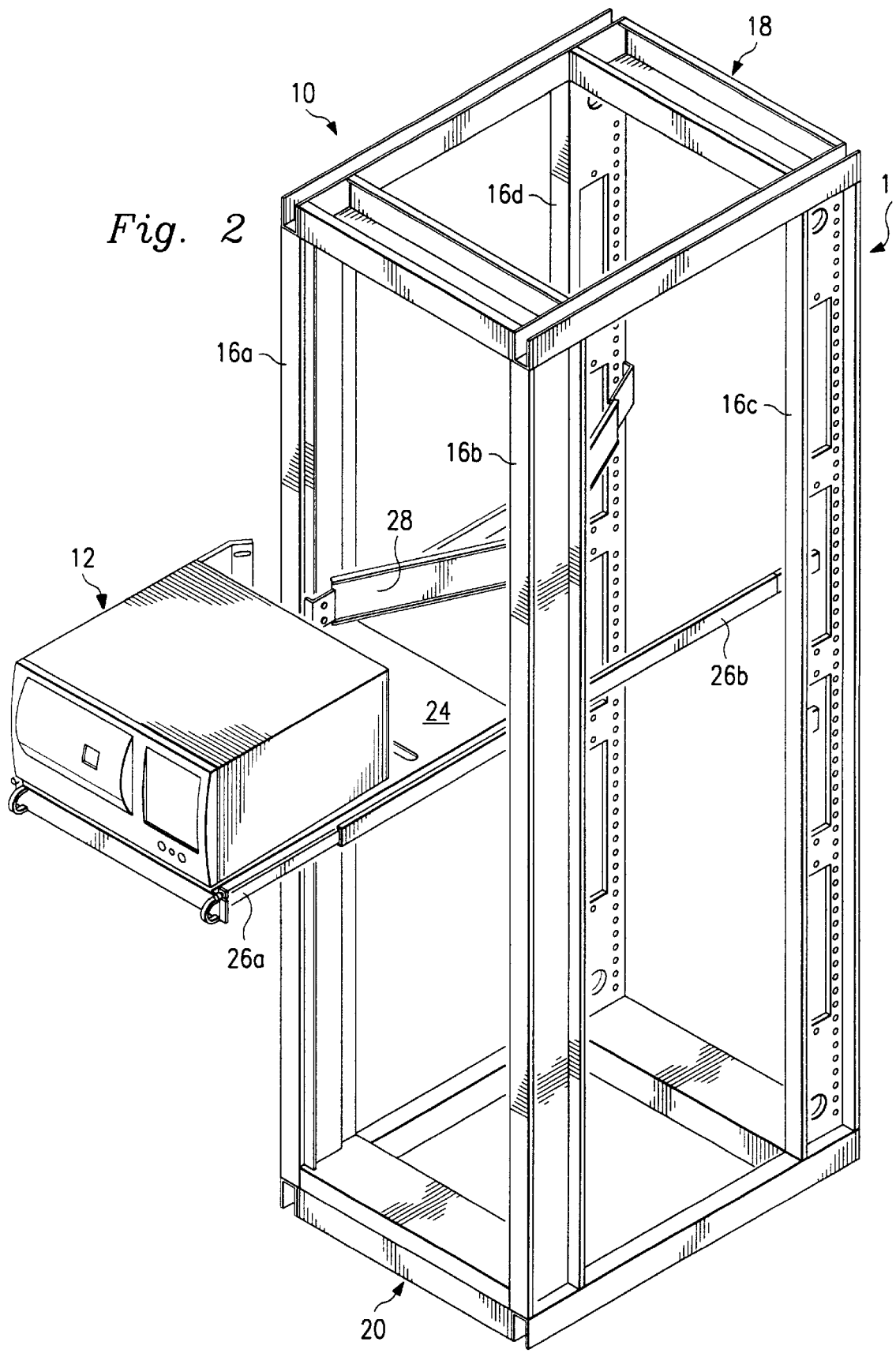
FIG. 2 is an view similar to FIG. 1 but depicting a shelf of the system of FIG. 1 in an extended position.

As shown in FIGS. 1 and 2, the computer 12 normally rests on its side on the shelf 24. A cable management arm 28 is attached to the shelf 24 and to the post 16d for receiving cables (not shown) attached to the computer for the purpose of facilitating the placement and organization of the cables. Since the cable management arm 28 is conventional it will not be described in further detail.

Figure 3:
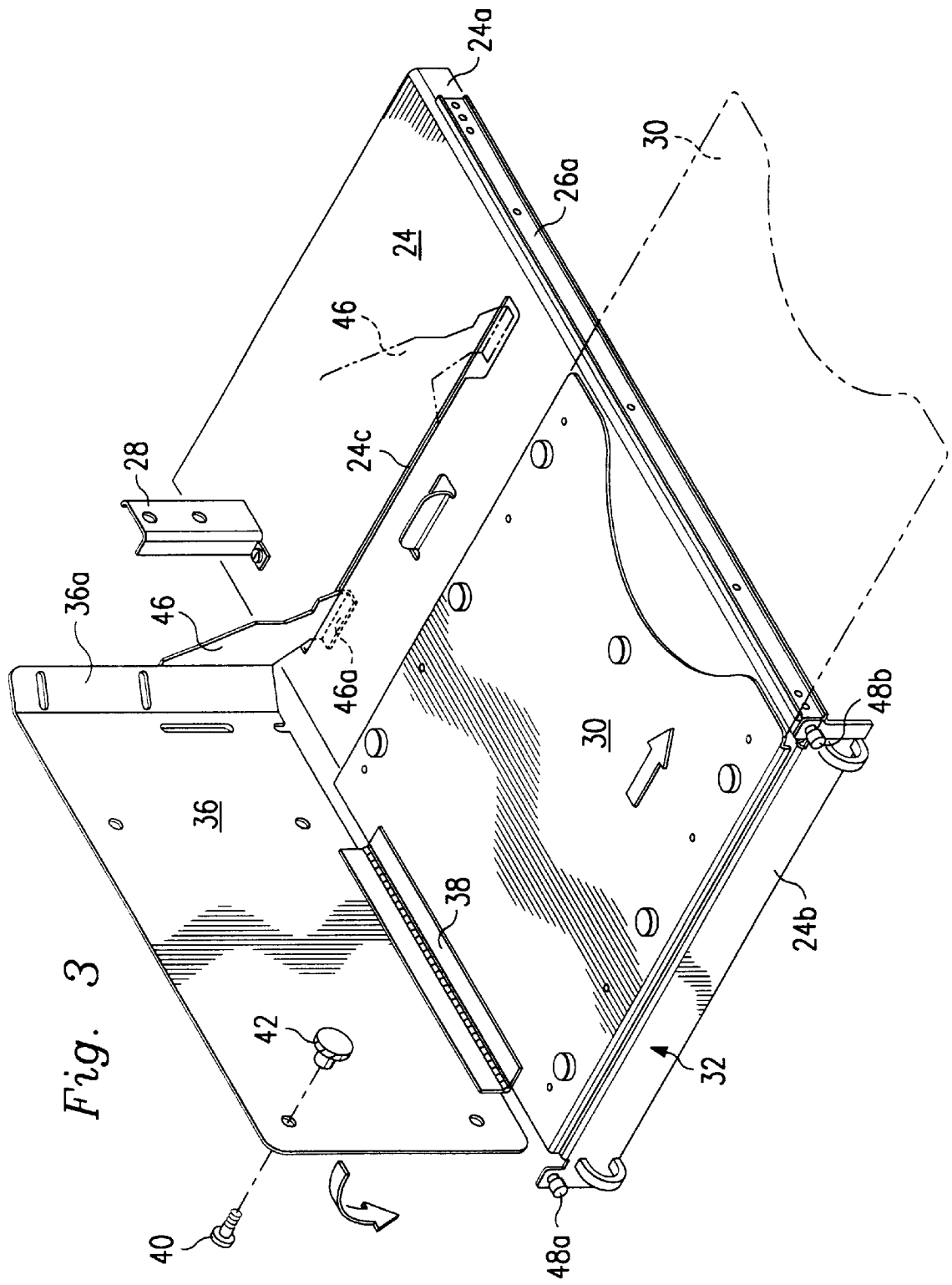
FIG. 3 is an isometric view of the shelf of the system of FIGS. 1 and 2.

Referring to FIG. 3, the shelf 24 is in the form of a horizontally extending plate having two relatively short side walls, one of which is shown by the reference numeral 24a, and a front wall 24b. A rail 26a of the ball bearing slide 26 is fastened to the side wall 24a and another rail 26b of the slide 26 is affixed to the posts 16b and 16c (FIG. 2) of the cabinet 14. The rails 26a and 26b are disposed in a telescoping relation, and, although not shown in the drawings, it is understood that ball bearings (not shown) extend between the rails to permit slidable movement between the rails.

It is also understood that the slide 26 is provided with a locking mechanism to lock the shelf in an extended position. For example, a locking tab (not shown) can be provided on one of the rails 26a or 26b which engages the other rail to lock the shelf 24 in its extended position and which can be manually released to unlock the shelf. Since, as stated above, the slide 26 is conventional, it will not be described in any further detail. Although not shown, it is understood that a rail of another slide is fastened to the other side wall of the shelf 24 and a corresponding rail of the latter slide is affixed to the posts 16a and 16d. Since this other slide is identical to the slide 26, it will not be described in detail. As a result, the shelf 24 can slide between the retracted position of FIG. 1 and the extended position of FIG. 2. It is understood that, in a normal installation, several shelves identical to shelf 24 will be provided for receiving additional computers.

A horizontally extending tray 30 (FIG. 3) is disposed on a portion of the shelf 24 and is adapted for slidable movement in a direction indicated by the arrow in FIG. 3 to and from an extended position shown by the phantom lines and a retracted position shown by the solid lines. To this end, the tray 30 is mounted to the shelf 24 by another pair of ball bearing slides one of which is shown by the reference numeral 32. The slide 32 is similar to the slide 26 with the exception that the slide 32 is smaller in size than the slide 26. Although not clear from the drawings, it is understood that a rail of the slide 32 is fastened to the shelf 24, and another rail of the slide 32 is fastened to the tray 30. The rails of the slide 32 are disposed in a telescoping relation and are provided with ball bearings and a stop mechanism, including a locking tab, as described above. It is understood that the other ball bearing slide associated with the tray 30 is identical to the slide 32 and is disposed on the other side edge of the tray 30. As a result, the tray 30 can slide between the retracted position shown by the solid lines in FIG. 3 and the extended position shown by the phantom lines in FIG. 3 and by the solid lines in FIG. 4, for reasons to be described.

Figure 4:
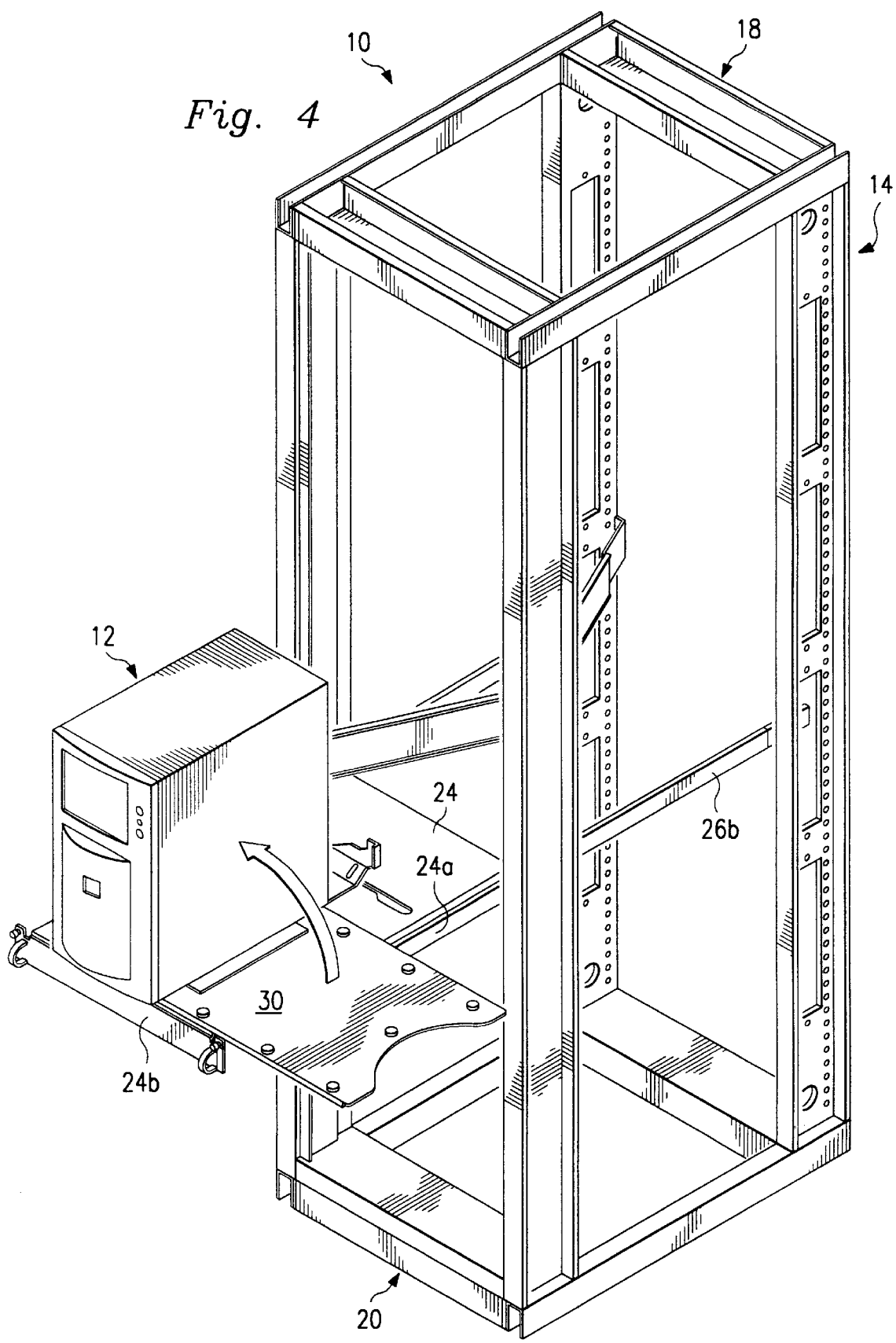
FIG. 4 is an view similar to FIG. 2 but depicting the computer in a serviceable position on the shelf.

A mounting plate 36 (FIG. 3) is pivotally mounted to one end of the tray 30 by a hinge 38 for movement in the direction indicated by the arrow between a vertical position, as viewed in FIG. 3, and a horizontal position shown in FIG. 4. A mounting stud 40 (FIG. 3) extends through an opening through the plate 36 and receives a nut 42. Three additional openings are formed through the plate and are spaced in a pattern corresponding to the pattern of the "feet" formed on the bottom plate of the computer 12. Although not shown in the drawings, it is understood that three additional studs 40 are provided through these latter openings and are engaged by three corresponding additional nuts 42. As a result, the mounting plate 36 can be positioned in its vertical position shown in FIG. 3, and the computer 12 can be positioned with one of its sides on the tray 30, that is, with its longitudinal axis extending horizontally, as shown in FIGS. 1 and 2. In this position of the computer 12, the studs 40 can be inserted in the mounting holes for the feet of the computer, and the nuts 42 placed over the studs (from the interior of the computer 12), to secure the computer 12 to the mounting plate 36.

An end portion 36a of the mounting plate 36 is bent relative to the remaining portion of the plate and receives a retaining bracket 46 which is affixed to the end portion in any known manner. The end portion 36a extends at an angle, such as forty-five degrees, to the remaining portion of the plate 36, and the bracket 46 extends at a complementary angle, which, in this example, is forty-five degrees, to the end portion so that the bracket extends at ninety degrees to the plate 36. The distal end portion of the bracket 46 extends through an end of a slot 24c formed in a portion of the shelf 24 not covered by the tray 30 so that the corresponding end of the bracket extends underneath the shelf 34 as viewed in FIG. 3. The latter end is bent at a ninety degree angle to the remaining portion of the bracket 46 to form a tab 46a, the width of which is greater than the width of the slot 24c to prevent movement of the mounting plate 36 from its vertical position shown in FIG. 3 to its horizontal position shown in FIG. 4. The other end of the slot 24a is enlarged to the extent that its width exceeds that of the tab 46a of the bracket 46 to permit the bracket to clear the shelf 24 under conditions to be described.

A pair of captive thumbscrews 48a and 48b are mounted to the front wall 24b of the shelf 24 that respectively extend in corresponding openings in the posts 16a and 16b (FIG. 1) of the cabinet 14. This locks the shelf 24 in its retracted position in the cabinet 14, as shown in FIG. 1.

The shelf 24 is normally in its retracted position in the cabinet 14 as shown in FIG. 1 with the computer 12 resting on the tray 30 with its longitudinal axis extending horizontally. The thumbscrews 48a and 48b (better shown in FIG. 3) are engaged with the posts 16a and 16b of the cabinet 14 to retain the shelf 24 in this retracted position. In this position, the tray 30 is also in its retracted position relative to the shelf 24, and the computer 12 is positioned so that one of its side walls rests on the tray 30. Also, the studs 40 extend in the corresponding openings formed in the bottom plate of the computer 12, and are engaged by the nuts 42 to secure the computer 12 to the plate 36.

To service the computer 12, the thumbscrews 48a and 48b are loosened and the shelf 24 is pulled outwardly until it reaches the position shown in FIG. 2. As stated above, the locking tab associated with the ball bearing slides, including the slide 26, locks the shelf 24 in this extended position with the computer 12 extending outside cabinet 14. The tray 30 is then moved to the right as viewed in FIG. 3 to its extended position shown by the phantom lines in FIG. 3 and by the solid lines of FIG. 4, with the locking tab associated with the ball bearing slides, including the slide 32, associated with the tray 30 locking the shelf in this extended position.

The computer 12 is then pivoted to its upright position shown in FIG. 4 causing the mounting plate 36 to pivot about the hinge 38 to its horizontal position. This positions the computer 12 so that its longitudinal axis extends vertically. Since the tray 30 was initially moved to its extended position, the computer 12 is approximately centered between the ball bearing slides, including the slide 26, associated with the shelf 24, thus distributing the load evenly between the two slides. This upright position of the computer 12 exposes both side plates of the computer chassis so that they can be removed for service.

When the service is complete, the above steps are reversed to place the computer 12 in its normal position in the cabinet 14. More particularly, the computer 12 is pivoted from its vertical position of FIG. 4 to its horizontal position of FIG. 2. The tray 30 is then unlocked by disengaging its corresponding locking tab, as discussed above, and the tray is then moved from its extended position of FIG. 4 to its retracted position of FIG. 2. The shelf 24, with the computer disposed on the tray 30, is then unlocked by disengaging its corresponding locking tab and pushed back towards its fully retracted position in the cabinet 14.

The present invention thus enjoys several advantages. For example, all the space-efficiency advantages of a rack mount system are retained while the computers are easily positioned for service without having to remove them from the shelves of the rack mount system and without having to disconnect the cables attached to the computers.

It is understood that variations may be made in the foregoing without departing from the scope of the present invention. For example, the rack mount system and method of the present invention is not limited to use with computers, but are equally applicable to other components.

It is understood that other modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A computing system comprising a computer; and a rack mount system for the computer, the rack mount system comprising a cabinet, a shelf mounted in the cabinet for slidable movement between a retracted and an extended position relative to the cabinet, a tray mounted on the shelf for slidable movement relative to the shelf between an extended and retracted position, the tray adapted to receive the computer, and a pivot member for permitting pivotal movement of the computer relative to the tray.

2. The system of claim 1 wherein the movement of the tray is transverse to the direction of movement of the shelf.

3. The system of claim 1 further comprising a member for permitting the pivotal movement of the computer only when the tray is in its extended position.

4. The system of claim 1 wherein the pivot member permits pivotal movement of the computer to and from a position in which the computer can be serviced.

5. The system of claim 4 wherein the computer is normally placed on the tray with the longitudinal axis of the computer extending horizontally and wherein the computer is pivotal to a position in which the longitudinal axis extends vertically.

6. The system of claim 5 wherein, in the position in which the longitudinal axis of the computer extends vertically, the side panels of the computer can be removed for servicing.

7. The system of claim 1 further comprising a pair of slides disposed along the longitudinal edges of the shelf to permit the slidable movement of the shelf.

8. The system of claim 7 wherein the pivotal movement of the computer places the computer approximately centered between the slides.

9. The system of claim 1 wherein the pivot member comprises a plate pivotally mounted to the tray.

10. The system of claim 9 further comprising a stud disposed on the plate and wherein the bottom plate of the computer has at least one opening and wherein the stud extends in the opening.

11. The system of claim 10 further comprising a fastener attached to the stud to secure the computer to the plate.

12. The system of claim 7 further comprising an additional pair of slides disposed along the longitudinal edges of the tray to permit the slidable movement of the tray.

13. The system of claim 1 wherein the computer is pivotal to a position where it can be serviced.

14. The system of claim 1 wherein there is a plurality of cables connected to the computer and further comprising an arm connected to the cabinet and to the shelf for receiving the cables.

15. A method of mounting a computer in a rack mount system having a slidable shelf, comprising the step of sliding the computer and the shelf in a first direction to a position outside the cabinet of the rack mount system, sliding the computer relating to the shelf in a second direction transverse to the first direction, and pivoting the computer relative to the shelf to permit it to be serviced.

16. The method of claim 15 wherein the second step of sliding is after the first step of sliding and wherein the step of pivoting is after the second step of sliding.

17. The method of claim 16 wherein the step of pivoting is permitted only after the second step of sliding.

18. The method of claim 15 further comprising the step of placing the computer on a tray with the longitudinal axis of the computer extending horizontally and wherein the step of pivoting comprises the step of pivoting the computer to a position in which the longitudinal axis extends vertically.

19. The method of claim 18 wherein the second step of sliding comprises sliding the tray relative to the shelf.

20. The method of claim 18 wherein, in the position in which the longitudinal axis of the computer extends vertically, the side panels of the computer can be removed for servicing.

21. The method of claim 18 further comprising the step of fastening the computer to a plate pivotally mounted to the tray, the step of pivoting comprising the step of pivoting the plate relative to the tray.

22. The method of claim 15 wherein the step of pivoting places the computer approximately centered on the shelf.

23. A rack mount system for a component, the system comprising a cabinet, a shelf mounted in the cabinet for slidable movement between a retracted and an extended position relative to the cabinet, a tray mounted on the shelf for slidable movement relative to the shelf between an extended and retracted position, the tray adapted to receive the component, and a pivot member for permitting pivotal movement of the component relative to the tray.

24. The system of claim 23 wherein the movement of the tray is transverse to the direction of movement of the shelf.

25. The system of claim 23 further comprising a member for permitting the pivotal movement of the component only when the tray is in its extended position.

26. The system of claim 23 wherein the pivot member permits pivotal movement of the component to and from a position in which the component can be serviced.

27. The system of claim 26 wherein the component is normally placed on the tray with the longitudinal axis of the component extending horizontally and wherein the component is pivotal to a position in which the longitudinal axis extends vertically.

28. The system of claim 27 wherein, in the position in which the longitudinal axis of the component extends vertically, the side panels of the component can be removed for servicing.

29. The system of claim 23 further comprising a pair of slides disposed along the longitudinal edges of the shelf to permit the slidable movement of the shelf.

30. The system of claim 29 wherein the pivotal movement of the component places the component approximately centered between the slides.

31. The system of claim 23 wherein the pivot member comprises a plate pivotally mounted to the tray.

32. The system of claim 31 further comprising a stud disposed on the plate and wherein the bottom plate of the component has at least one opening and wherein the stud extends in the opening.

33. The system of claim 32 further comprising a fastener attached to the stud to secure the component to the plate.

34. The system of claim 29 further comprising an additional pair of slides disposed along the longitudinal edges of the tray to permit the slidable movement of the tray.

35. The system of claim 1 wherein the component is pivotal to a position where it can be serviced.

36. The system of claim 35 wherein there is a plurality of cables connected to the component and further comprising an arm connected to the cabinet and to the shelf for receiving the cables.

37. A method of mounting a component in a rack mount system having a slidable shelf, comprising the step of sliding the component and the shelf in a first direction to a position outside the cabinet of the rack mount system, sliding the component relating to the shelf in a second direction transverse to the first direction, and pivoting the component relative to the shelf to permit it to be serviced.

38. The method of claim 37 wherein the second step of sliding is after the first step of sliding and wherein the step of pivoting is after the second step of sliding.

39. The method of claim 38 wherein the step of pivoting is permitted only after the second step of sliding.

40. The method of claim 37 further comprising the step of placing the component on a tray with the longitudinal axis of the component extending horizontally and wherein the step of pivoting comprises the step of pivoting the component to a position in which the longitudinal axis extends vertically.

41. The method of claim 40 wherein the second step of sliding comprises sliding the tray relative to the shelf.

42. The method of claim 40 wherein, in the position in which the longitudinal axis of the component extends vertically, the side panels of the component can be removed for servicing.

43. The method of claim 40 further comprising the step of fastening the component to a plate pivotally mounted to the tray, the step of pivoting comprising the step of pivoting the plate relative to the tray.

44. The method of claim 37 wherein the step of pivoting places the component approximately centered on the shelf.

* * * * *